United States Patent
Gao (10) Patent No.: US 8,871,102 B2
(45) Date of Patent: Oct. 28, 2014

(54) METHOD AND SYSTEM FOR FABRICATING A NARROW LINE STRUCTURE IN A MAGNETIC RECORDING HEAD

(75) Inventor: Wei Gao, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 150 days.

(21) Appl. No.: 13/115,621

(22) Filed: May 25, 2011

(65) Prior Publication Data

US 2012/0298621 A1 Nov. 29, 2012

(51) Int. Cl.
| | |
|---|---|
| *B44C 1/22* | (2006.01) |
| *C03C 15/00* | (2006.01) |
| *H01L 21/302* | (2006.01) |
| *H01L 43/12* | (2006.01) |
| *G11B 5/31* | (2006.01) |

(52) U.S. Cl.
CPC .............. *H01L 43/12* (2013.01); *G11B 5/3163* (2013.01)
USPC ................... 216/22; 216/41; 216/47; 216/58; 216/64; 216/69; 216/71; 438/689; 438/706; 438/710; 438/717; 438/725; 360/110; 360/313

(58) Field of Classification Search
CPC .... G11B 5/127; G11B 5/3163; G11B 5/3116; G11B 5/00; G11B 2005/0021; H01L 43/12; H01L 21/3081; H01L 21/32139; H01F 41/34; B82Y 5/00
USPC ................. 216/22, 41, 47, 58, 64, 67, 69, 71; 438/689, 706, 710, 717, 725; 360/110, 360/313
See application file for complete search history.

(56) References Cited

U.S. PATENT DOCUMENTS

| | | | |
|---|---|---|---|
| 5,024,896 A | 6/1991 | Mathad et al. | |
| 5,780,161 A | 7/1998 | Hsu | |
| 5,994,226 A | 11/1999 | Kadomura | |
| 6,251,545 B1 | 6/2001 | Levinson | |
| 6,385,018 B1 | 5/2002 | Mukoyama | |
| 6,518,206 B1 | 2/2003 | Kumar et al. | |
| 6,627,355 B2 | 9/2003 | Levinson et al. | |
| 6,667,493 B2 | 12/2003 | Ooshima | |
| 6,692,898 B2 | 2/2004 | Ning | |
| 6,729,014 B2 | 5/2004 | Lin et al. | |

(Continued)

OTHER PUBLICATIONS

Kautzky et al., "The Application of Collimated Sputtering to Abutted Junction Reader Processing," datatech, pp. 111-117, published under "Other Publications" as cited on U.S. Patent No. 7,070,697 B2, with a patent date of Jul. 4, 2006.

*Primary Examiner* — Nadine Norton
*Assistant Examiner* — Christopher Remavege (57) ABSTRACT

A method for fabricating a structure in magnetic recording head is described. First and second hard mask layers are provided on the layer(s) for the structure. A BARC layer and photoresist mask having a pattern are provided on the second hard mask layer. The pattern includes a line corresponding to the structure. The pattern is transferred to the BARC layer and the second hard mask layer in a single etch using an etch chemistry. At least the second hard mask layer is trimmed using substantially the same first etch chemistry. A mask including a hard mask line corresponding to the line and less than thirty nanometers wide is thus formed. The pattern of the second hard mask is transferred to the first hard mask layer. The pattern of the first hard mask layer is transferred to the layer(s) such that the structure has substantially the width.

16 Claims, 7 Drawing Sheets

(56) References Cited

U.S. PATENT DOCUMENTS

| | | |
|---|---|---|
| 6,824,932 B2 | 11/2004 | Bukofsky et al. |
| 6,861,177 B2 | 3/2005 | Pinarbasi et al. |
| 6,872,467 B2 | 3/2005 | Qian et al. |
| 6,983,531 B2 | 1/2006 | Horng et al. |
| 6,996,894 B2 | 2/2006 | Hsiao et al. |
| 7,002,781 B2 | 2/2006 | Sugawara |
| 7,008,550 B2 | 3/2006 | Li et al. |
| 7,037,850 B2 * | 5/2006 | Lee et al. ............... 438/725 |
| 7,070,697 B2 | 7/2006 | Freitag et al. |
| 7,159,304 B2 | 1/2007 | Arasawa et al. |
| 7,181,828 B2 * | 2/2007 | Yazawa et al. ............ 29/603.12 |
| 7,284,316 B1 | 10/2007 | Huai et al. |
| 7,380,332 B2 | 6/2008 | Bedell et al. |
| 7,551,408 B2 | 6/2009 | Shimazawa et al. |
| 7,555,828 B2 | 7/2009 | Breyta et al. |
| 7,562,436 B2 | 7/2009 | Jayasekara |
| 7,579,282 B2 | 8/2009 | Rauf et al. |
| 7,605,006 B2 | 10/2009 | Morijiri et al. |
| 7,640,650 B2 | 1/2010 | Araki et al. |
| 7,771,894 B2 | 8/2010 | Wu |
| 7,824,562 B2 * | 11/2010 | Pelhos ............... 216/22 |
| 7,869,166 B2 | 1/2011 | Miyauchi et al. |
| 8,091,210 B1 | 1/2012 | Sasaki et al. |
| 8,225,488 B1 | 7/2012 | Zhang et al. |
| 8,233,248 B1 | 7/2012 | Li et al. |
| 8,313,889 B2 | 11/2012 | Yu et al. |
| 8,394,280 B1 | 3/2013 | Wan et al. |
| 2002/0007550 A1 | 1/2002 | Shoji |
| 2002/0064005 A1 | 5/2002 | Arasawa et al. |
| 2002/0071224 A1 | 6/2002 | Tagawa et al. |
| 2002/0195416 A1 | 12/2002 | Padmapani |
| 2004/0103524 A1 | 6/2004 | Breyta et al. |
| 2004/0145836 A1 | 7/2004 | Kojima et al. |
| 2004/0229430 A1 | 11/2004 | Findeis et al. |
| 2006/0234483 A1 | 10/2006 | Araki et al. |
| 2007/0023916 A1 | 2/2007 | Hah et al. |
| 2007/0026538 A1 | 2/2007 | Jayasekara |
| 2007/0242396 A1 | 10/2007 | Shimazawa et al. |
| 2008/0007877 A1 | 1/2008 | Takashita et al. |
| 2009/0139958 A1 * | 6/2009 | Pentek et al. ............... 216/22 |
| 2009/0200264 A1 * | 8/2009 | Cyrille et al. ............... 216/22 |
| 2010/0308012 A1 * | 12/2010 | Yamamoto ............... 216/22 |
| 2011/0032645 A1 * | 2/2011 | Noel et al. ............... 360/326 |
| 2011/0198314 A1 * | 8/2011 | Wang et al. ............... 216/22 |
| 2012/0298621 A1 | 11/2012 | Gao |

* cited by examiner

METHOD AND SYSTEM FOR FABRICATING A NARROW LINE STRUCTURE IN A MAGNETIC RECORDING HEAD

BACKGROUND

Figure 1:
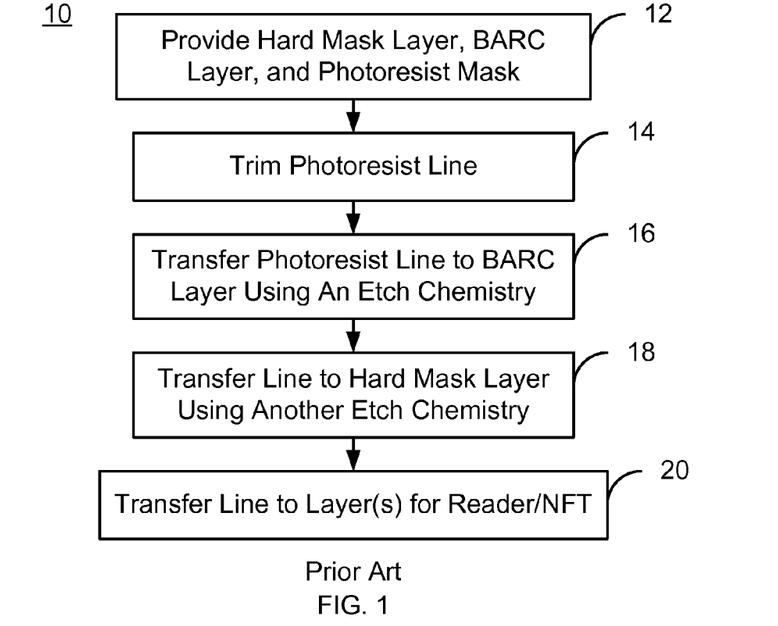
FIG. 1 is a flow chart depicting a conventional method for fabricating a magnetic recording transducer.
Figure 2:
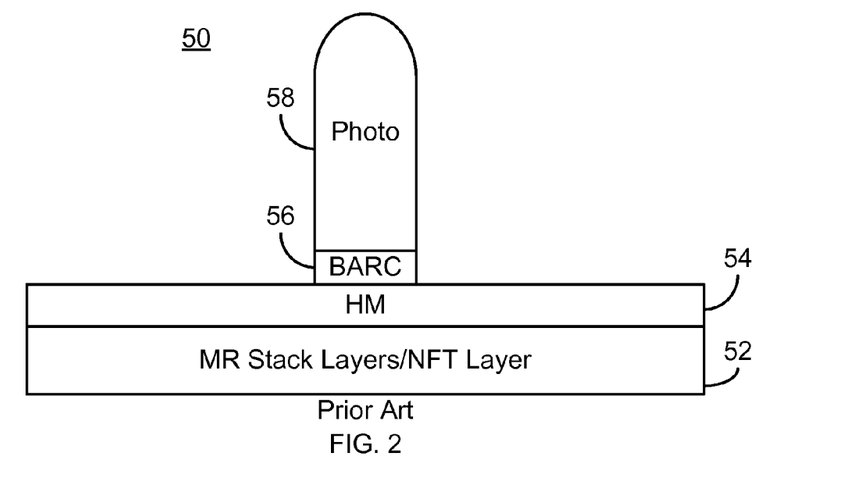
FIG. 2 depicts a conventional magnetic recording transducer during fabrication.
Figure 3:
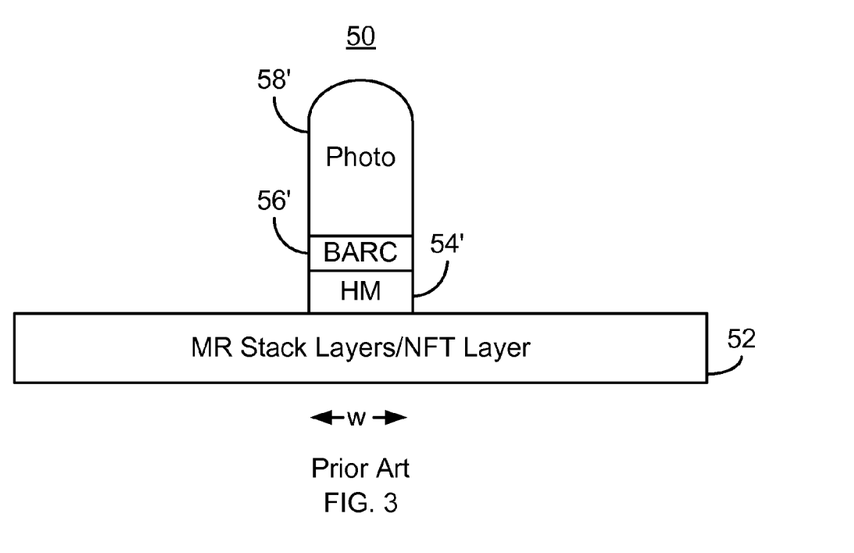
FIG. 3 depicts a conventional magnetic recording transducer during fabrication.

FIG. 1 depicts a conventional method 10 for fabricating a structure in magnetic recording technology applications. FIGS. 2-3 depict a conventional transducer 50 during fabrication using the method 10. FIGS. 2-3 are not to scale. The method 10 typically commences after the material(s) for the structure have been deposited. For example, the method 10 may be used in fabricating a conventional magnetoresistive read sensor in a read transducer. Alternatively, the conventional method 10 might be used in fabricating the pin portion of a conventional near-field transducer (NFT) in an energy assisted magnetic recording (EAMR) write transducer.

The conventional method 10 commences by providing a conventional hard mask layer, a conventional bottom antireflective coating (BARC) layer, and a photoresist mask, via step 12. The conventional BARC layer aids in patterning of the conventional photoresist mask. The conventional photoresist mask has the desired pattern. For structures such as a conventional magnetoresistive sensor or pin portion of the NFT, the photoresist mask includes a line.

The photoresist line in the conventional photoresist mask is trimmed, via step 14. Typically, an oxygen plasma reactive ion etch (RIE) or other analogous process is used to reduce the width of the photoresist line. The pattern of the photoresist mask is then transferred to the BARC layer, via step 16. Typically, step 16 is transferred to the BARC layer using an etch chemistry appropriate to the BARC layer. FIG. 2 depicts the conventional transducer 50 after step 16 is performed. The layers 52 for the device 52, hard mask 54, BARC layer 56 and photoresist mask 58 are shown. If a conventional magnetoresistive structure is to be formed, the stack of layers 52 typically includes an antiferromagnetic (AFM) layer, a pinned layer, a nonmagnetic spacer layer, and a free layer. In addition, seed and/or capping layers may be used. The conventional layers 52 reside on an underlayer (not shown), which may be a substrate. The conventional hard mask layer 54 is typically a material such as SiC or diamond-like carbon (DLC). The BARC layer 56 is typically an organic BARC, such as AR3. Also shown is the photoresist mask 58. The line portion of the photoresist mask 58 is shown. Because step 16 has been performed, the BARC 56 has the same width as the photoresist line 58.

A conventional hard mask is defined from the hard mask layer 54, via step 18. Stated differently, the line/pattern of the conventional photoresist mask 58 and BARC 56 is transferred to the hard mask layer 54. Step 18 typically includes performing an RIE appropriate to the material used for the hard mask 54. FIG. 3 depicts the conventional transducer 50 after step 18 is carried out. Thus, the conventional hard mask 54' has the pattern of the photoresist mask 58' and BARC layer 56'. The hard mask 54' thus has the same width, w, as the BARC 56' and photoresist line 58'. As can be seen in FIG. 3, a portion of the photoresist 58' remains after step 18 is performed.

The structure is defined, via step 20. Step 20 typically includes ion milling the transducer 50 or performing an RIE. Thus, the portion of the magnetoresistive stack or NFT layer 52 exposed is removed. The photoresist 58' remaining after step 18 aids in performing step 20. In particular, the photoresist 58' aids in ensuring that the desired portion of the underlying device layer(s) 52 remain covered. Some or all of the photoresist 58' may be consumed in step 20. Fabrication of the conventional transducer 50 may then be completed.

Although the conventional method 10 allows the conventional transducer 50 to be fabricated with line widths below one hundred nanometers, there are several drawbacks. The current trend is to higher density recording and, therefore, smaller track widths. The width of the structure to be fabricated is thus desired to be reduced. To do so, the width, w, of the mask 54', 56', and 58' are also desired to be decreased. For example, in some applications, the width of the structure desired to be fabricated from the hard mask 54' may be lower than fifty nanometers. The conventional method 10 may not be capable of fabricating a line at such small widths. For example, the photoresist line 58' is typically quite thick—on the order of 0.2 microns or more. When such a thick resist line has such a narrow width, the resist line may bend or fall during fabrication. Alternatively, the photoresist line 58' may have a large footing. As a result, there may be large variation in the width of the structure fabricated from the layers 52 and a large wafer to wafer variation. Such variations are undesirable. Yield may also be adversely affected.

Accordingly, what is needed is a system and method for improving the fabrication of a structure in a magnetic recording transducer.

BRIEF SUMMARY OF THE INVENTION

A method for fabricating a structure from layer(s) corresponding to the structure in magnetic recording head is described. The method includes providing a first hard mask layer on the layer(s) and a second hard mask layer on the first hard mask layer. A bottom antireflective coating (BARC) layer is provided on the second hard mask layer. A photoresist mask having a pattern is provided on the second hard mask layer. The pattern includes a line corresponding to the structure. The pattern is transferred to the BARC layer and the second hard mask layer in a single etch using a first etch chemistry. At least the second hard mask layer is trimmed using a second etch chemistry substantially the same as the first etch chemistry to provide a mask including a hard mask line corresponding to the line and having a width of less than thirty nanometers. The pattern of the second hard mask is also transferred to the first hard mask layer. The pattern of the first hard mask layer is transferred to the layer(s) such that the structure substantially has the width.

DETAILED DESCRIPTION OF THE PREFERRED EMBODIMENTS

Figure 4:
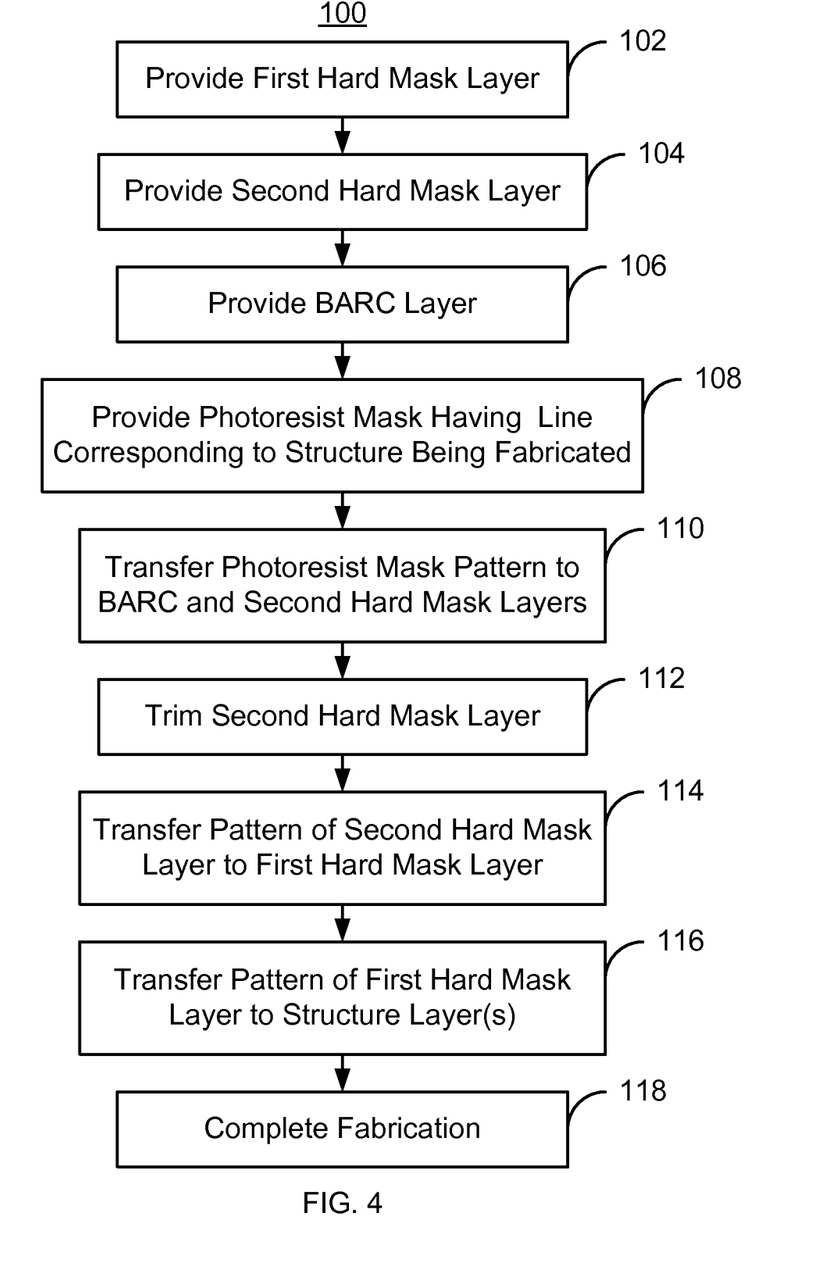
FIG. 4 is a flow chart depicting an exemplary embodiment of a method for fabricating a structure in a magnetic recording transducer.

FIG. 4 is an exemplary embodiment of a method 100 for providing magnetic recording transducer. For simplicity, some steps may be omitted. The method 100 is also described in the context of providing a single recording transducer. However, the method 100 may be used to fabricate multiple transducers at substantially the same time. The method 100 is also described in the context of particular layers. A particular layer may include multiple materials and/or multiple sub-layers. The method 100 also may start after formation of other portions of the magnetic recording transducer. For example, the method 100 commences after deposition of layer(s) from which the structure is desired to be formed. For example, if a magnetoresistive sensor is to be formed, then the method 100 starts after the layers for a magnetoresistive stack have been deposited. The magnetoresistive layers may include a pinning layer, a pinned layer, a nonmagnetic spacer layer, and a free layer. In addition, seed and/or capping layers may be used. The pinning layer may be an AFM or other layer configured to fix, or pin, the magnetization of the pinned layer. The pinned layer may be a synthetic antiferromagnetic (SAF) layer including magnetically coupled ferromagnetic layers separated by a nonmagnetic layer. The ferromagnetic layers may be termed pinned and reference sub-layers. The nonmagnetic spacer layer may be a conductive layer for a giant magnetoresistive structure, an insulator for a tunneling magnetoresistive structure, or may be another structure. The free layer is ferromagnetic and has a magnetization that is free to change in response to an external magnetic field, for example from a media. The free layer may have multiple sub-layers, as may the pinned and reference sub-layers. If an NFT is to be formed, then the method 100 starts after the material(s) for the NFT, such as Au, have been deposited.

A first hard mask layer is provided on the layer(s) for the structure, via step 102. Formation of the hard mask layer may include depositing at least one of SiC, aluminum oxide, amorphous carbon, silicon dioxide, and tantalum oxide. However, in other embodiments, other material(s) may be used. The hard mask layer provided in step 102 may be thick. For example, a SiC hard mask may be on the order of five hundred Angstroms thick. In other embodiments, other thicknesses including thicknesses greater than five hundred Angstroms, may be used. A second hard mask layer is provided on the first hard mask layer, via step 104. The second hard mask layer may include materials such as Cr, chrome oxide, and/or chrome oxynitride. In some embodiments, the second hard mask layer that is deposited is significantly thinner than the first hard mask layer. In some embodiments, the second hard mask layer is not more than two hundred Angstroms thick. In other embodiments, the second hard mask layer is not more than one hundred Angstroms thick. In some such embodiments, the second hard mask layer has a thickness of not more than fifty Angstroms. The second hard mask layer may also have a thickness of at least forty Angstroms. However, other thicknesses are possible.

A BARC layer is provided on the second hard mask layer, via step 106. The BARC layer reduces or eliminates reflections during fabrication of a photoresist mask, discussed below. In some embodiments, the BARC layer may be an antireflective coating such as AR3. The thickness of the BARC layer provided in step 106 may depend upon the wavelength of the light used in the photolithography, mentioned below.

A photoresist mask having a pattern is provided on the second hard mask layer, via step 108. In some embodiments, step 108 is performed through traditional photolithography. The pattern of the photoresist mask corresponds to the structure being fabricated. Thus, the pattern includes a line corresponding to the structure. For example, if the structure being fabricated is an NFT, the photoresist mask may have a disk-shaped portion corresponding to the NFT disk and a line corresponding to the NFT pin portion. Similarly, if the structure being fabricated is a magnetoresistive sensor, then the photoresist mask has a line corresponding to the sensor. The photoresist mask provided in step 108 may be fabricated using conventional photolithography. For example, a photoresist layer may be deposited, selected portions exposed to light of a desired wavelength, and then immersed in developer to remove the exposed portions. However, in another embodiment, the photoresist mask may be provided in another manner.

The pattern of the photoresist mask is transferred to both the BARC layer and the second hard mask layer in a single etch, via step 110. The etch performed in step 110 uses a first etch chemistry capable of removing both the BARC and second hard mask layers. In some embodiments, the etch chemistry includes oxygen and chlorine gas. Diluting gases such as He, $N_2$, and/or Ar may also be used. The etch performed in step 110 is an anisotropic RIE. Thus, the etch of step 110 does not remove material from the BARC layer and second hard mask at the same rate in all directions. Instead, the RIE of step 110 may be a vertical RIE, which removes the BARC layer and second hard mask layer at a much higher rate in a vertical direction than in another direction. Thus, the width of the line formed in the BARC and second hard mask layers is substantially the same as the width of the line in the photoresist mask. In some embodiments, the etch performed in step 110 is terminated based on endpoint detection. When the underlying layer is detected, the vertical RIE is stopped.

At least the second hard mask layer is trimmed using a second etch chemistry that is substantially the same as the first etch chemistry, via step 112. Also in step 112, the layers above the second hard mask layer, such as the BARC and photoresist layers, may also be trimmed. Because the same etch chemistry is used in step 112 and step 110, oxygen and chlorine may be used in step 112. Further, diluting gases such as Ar, $N_2$, and/or He might also be used. In some embodiments, the second etch is also an anisotropic RIE. However, such an anisotropic etch is a lateral RIE. Thus, material is removed significantly faster laterally (horizontally or parallel to the surface of the transducer) than in other directions. The change from a vertical to a lateral etch using the same chemistry, may accomplished by altering be other aspects of the etch. For example, substrate bias and/or gas flow rates may be adjusted. A mask including a hard mask line corresponding to the line is thus formed. The hard mask line has a width of less than thirty nanometers. In some embodiments, the width of the line may be not more than twenty nanometers. In some such embodiments, the line width may be ten nanometers or less.

The trimming in step 112 reduces the width of the line portion of the photoresist mask, BARC layer, and second hard mask layer in a predictable manner. In other words, the width of the second hard mask layer remaining after step 112 may be well controlled. For example, once calibrated, the lateral RIE may have a sigma of not more than one to two nanometers. Such a calibration may include measuring the change in width of a sample structure versus time for the same conditions as the etch performed in step 112. In some embodiments, the change in width versus time is repeatable and linear, which allows a well known amount of material to be removed in the etch of step 112. Therefore, a known width of the second hard mask remaining.

The pattern of the second hard mask is transferred to the first hard mask layer, via step 114. In some embodiments, an RIE appropriate for the first hard mask layer is used in step 114. The selectivity between the first and second hard mask layers is desired to be high. For example, the second hard mask layer may be Cr, while the first hard mask layer may be SiC. In some embodiments, the selectivity may be at least thirty to one (first hard mask layer to second hard mask layer). In other embodiments, the selectivity may be at least one hundred to one. Thus, the line pattern of the second hard mask layer may be transferred to the first hard mask layer without consuming a significant amount of the second hard mask layer and without substantially changing the width of the second hard mask layer.

The pattern of the first hard mask layer is transferred to the underlying layer(s) for the structure substantially, via step 116. Thus, the structure has substantially the same width as the trimmed first hard mask layer. Fabrication of the transducer may then be completed, via step 118.

Using the method 100, smaller width structures may be reliably made. For example, structures having widths of less than thirty nanometers may be fabricated. In some embodiments, sub-ten nanometer widths may be formed. Because the resist and second hard mask layer may both be trimmed in step 112, issues due to resist bending and footing may be reduced or eliminated. Thus, the trim process performed in step 112 may be repeatable and well controlled. In some embodiments, the standard deviation in the width does not exceed two nanometers. In some such embodiments, the standard of deviation in the width is one to two nanometers or less. Thus, fabrication of smaller width structures may be facilitated. Photoresist consumption may be less of an issue as hard mask layers are used. Further, the method 100 includes fewer process steps than the conventional method 10. Moreover, chemical etches (e.g. RIEs) may be used in fabricating the structure, which may reduce redeposition issues and eliminate the need for a photoresist strip. Thus, manufacturing of such small width structures may be simplified and yield improved.

Figure 5:
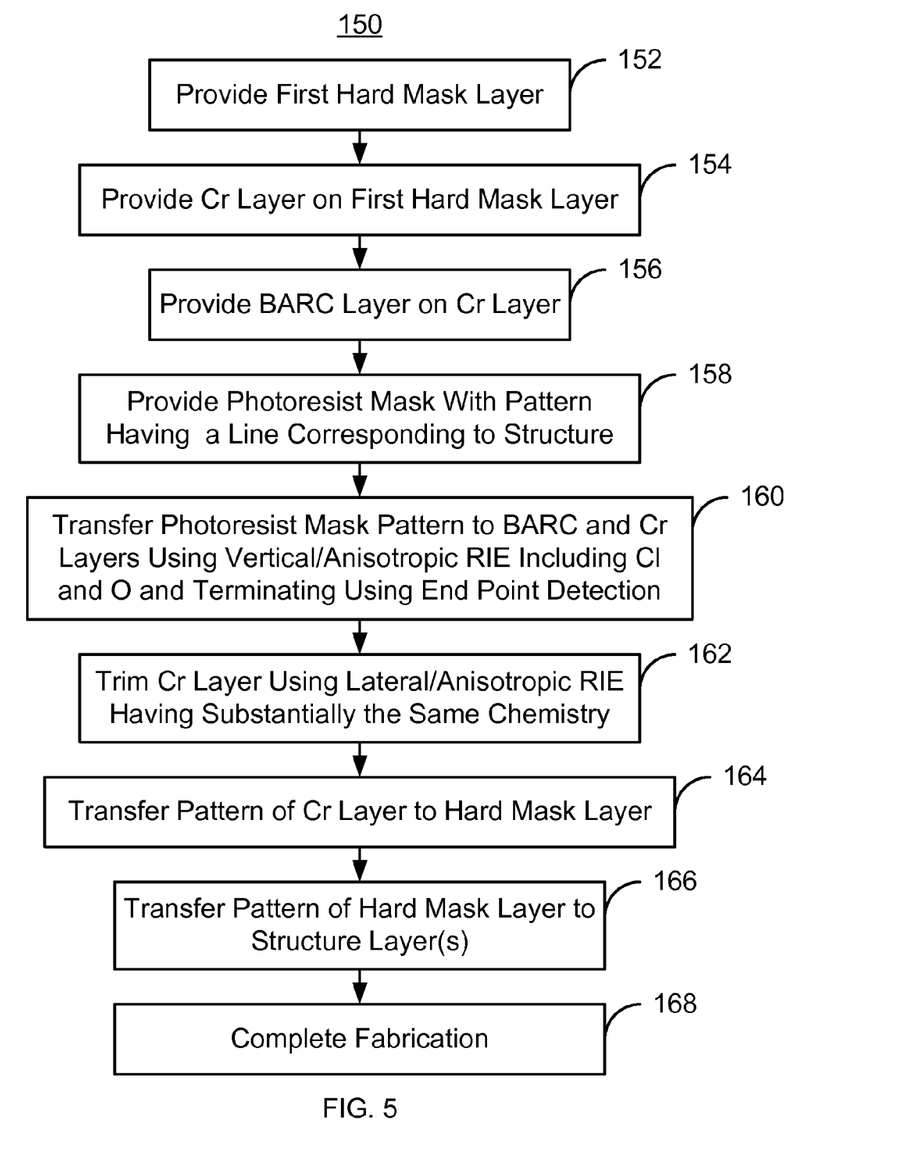
FIG. 5 is a flow chart depicting an exemplary embodiment of a method for fabricating a structure in a magnetic recording transducer.

FIG. 5 is a flow chart depicting another exemplary embodiment of a method 150 for fabricating a structure in a magnetic recording transducer. FIGS. 6-11 depict ABS views of another exemplary embodiment of a magnetic recording transducer 200 during fabrication. For clarity, FIGS. 6-11 are not to scale. The method 150 is described in the context of the transducer 200. For simplicity, some steps of the method 150 may be omitted. The method 150 is also described in the context of providing a single recording transducer 200. However, the method 150 may be used to fabricate multiple transducers at substantially the same time. The method 150 and transducer 200 are also described in the context of particular layers. A particular layer may include multiple materials and/or multiple sub-layers. The method 150 also may start after formation of other portions of the magnetic recording transducer 200. The method 150 commences after formation of the layer(s) for the structure being fabricated. For example, if the structure is a magnetoresistive sensor, then the method 150 starts after deposition of the magnetoresistive stack. The magnetoresistive layers may include a pinning layer, a pinned layer, a nonmagnetic spacer layer, and a free layer. In addition, seed and/or capping layers may be used. If the structure is an NFT, then the method may start after the material for the NFT is deposited. For example, the material may include Au or a gold alloy.

Figure 6:
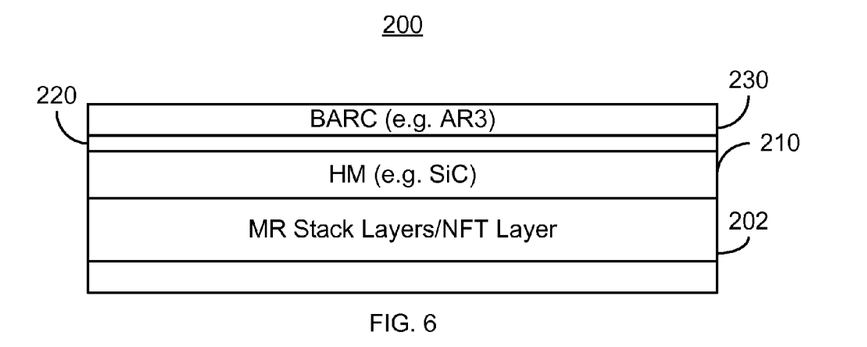
FIGS. 6-11 depict an exemplary embodiment of a magnetic recording transducer during fabrication.

A first, SiC hard mask layer is provided on the magnetoresistive stack, via step 152. Step 152 is analogous to step 102. The SiC hard mask may be at least five hundred Angstroms thick. A second, Cr hard mask layer is provided on the SiC hard mask layer, via step 154. Step 154 is analogous to step 104. In some such embodiments, the Cr hard mask layer is at least forty and not more than fifty Angstroms thick. A BARC layer is provided on the Cr hard mask layer, via step 156. Step 156 is analogous to step 106. The BARC layer and Cr hard mask layer are removable using the same etch chemistry. FIG. 6 depicts the transducer 200 after step 156 is completed. Thus, the layer(s) 202 for the structure being fabricated are shown. In some embodiments, the layer(s) 202 are layers of a magnetoresistive sensor stack. In other embodiments, the layer(s) 202 are a metal or metal alloy from which the NFT is to be formed. Also shown are SiC hard mask layer 210, Cr hard mask layer 220, and BARC layer 230.

Figure 7:
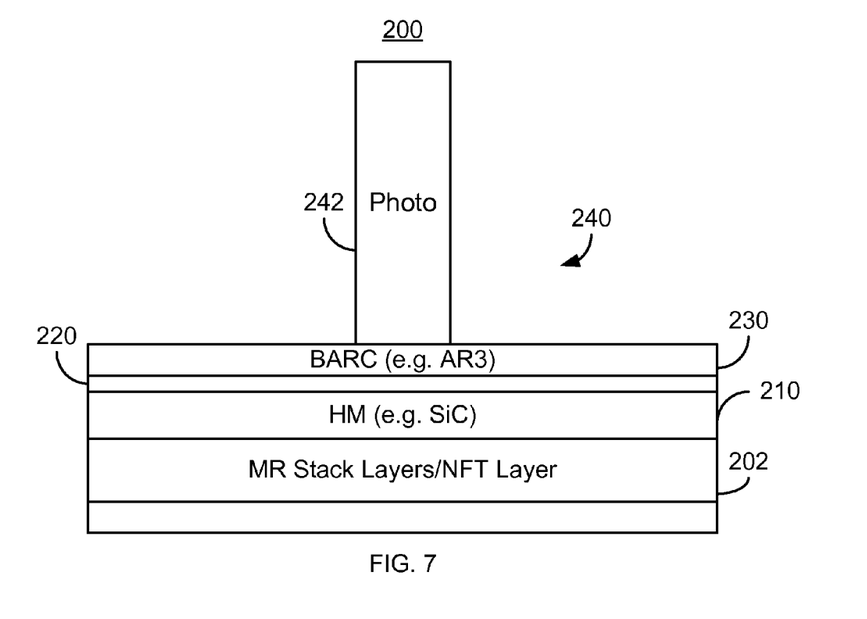

A photoresist mask having a pattern including a line is provided on the BARC layer 230, via step 158. Step 158 is analogous to step 108 and thus may include the use of conventional photolithography. FIG. 7 depicts the transducer 200 after step 158 is completed. Thus, a photoresist line 242 that is part of the photoresist mask 240 is shown. The line 242 corresponds to the structure and resides on the portion of the transducer 200. If an NFT is being formed, the photoresist mask 240 may have a disk-shaped portion (not shown) corresponding to the NFT disk and a line 242 corresponding to the NFT pin portion if an NFT is being formed. Similarly, the line 242 corresponds to the sensor if a magnetoresistive sensor is being formed.

Figure 8:
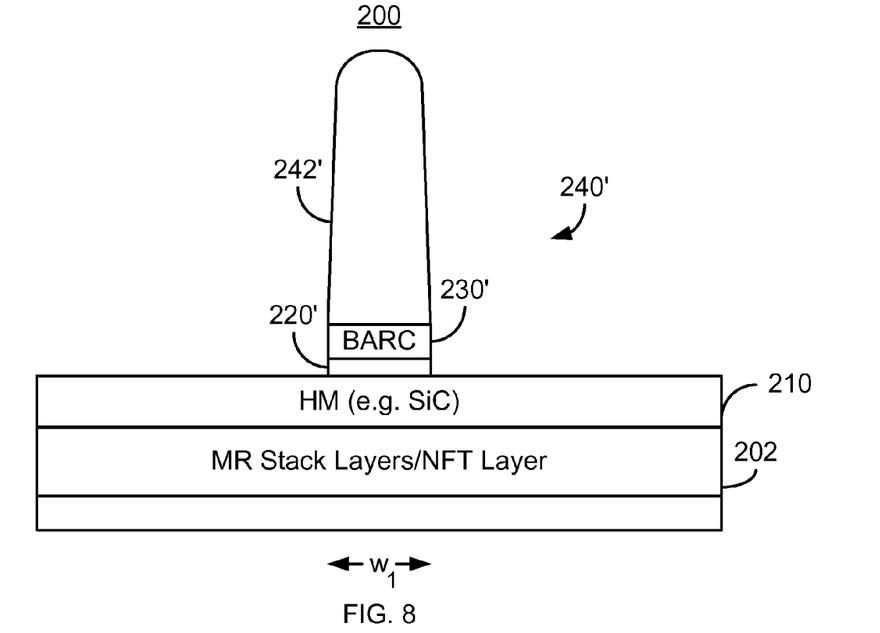

The pattern of the photoresist mask 240 is transferred to the BARC layer 230 and the Cr hard mask layer 220 in a single, vertical RIE, via step 160. Step 160 is analogous to step 110. The vertical RIE performed in step 160 uses an etch chemistry that includes oxygen and chlorine gas. Thus, the chemistry removes both the Cr hard mask 220 and the BARC 230. Diluting gases such as He, $N_2$, and/or Ar may also be used. Further, the vertical RIE is terminated using endpoint detection. FIG. 8 depicts the transducer 200 after step 160 is performed. Thus, a BARC line 230' and Cr hard mask line 220' are under the remaining photoresist line 242'. The width of the line formed in the BARC and second hard mask layers, $w_1$, is substantially the same as the width of the line 242' in the photoresist mask 240'. Note that some of the photoresist line 242' has been consumed in the RIE. The RIE performed in step 160 is terminated based on endpoint detection. When the underlying SiC hard mask layer 210 is detected, the vertical RIE is stopped.

Figure 9:
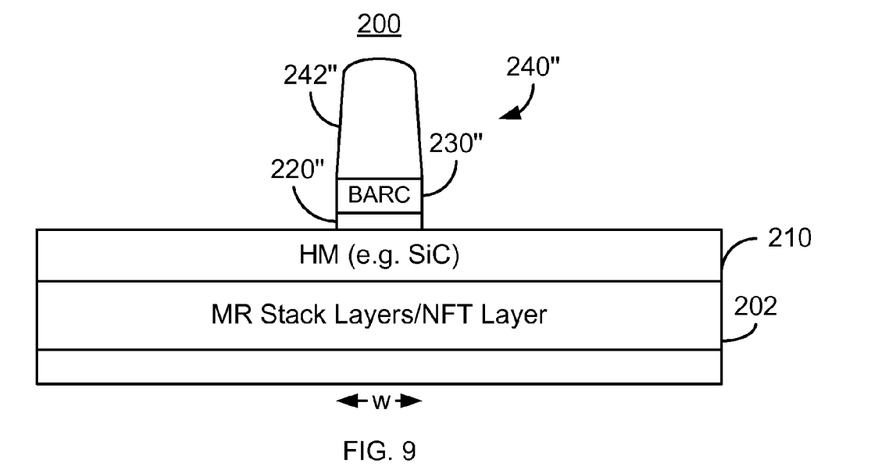

The Cr hard mask layer 220' and any layers, 230' and 242' on the Cr hard mask layer are trimmed using a lateral RIE, via step 162. The etch chemistry used in step 162 includes oxygen and chlorine and is substantially the same as the etch chemistry for step 160. Further, diluting gases such as Ar, $N_2$, and/or He might also be used. In some embodiments, the second etch is also an anisotropic RIE. FIG. 9 depicts the transducer 200 after step 162 is performed. Thus, the Cr hard mask layer 220", the BARC layer 230", and the photoresist lien 240' have been trimmed. The trimming in step 162 reduces the width of these layers 220", 230", and 242" to w in a predictable manner. The hard mask line width is less than thirty nanometers. In some embodiments, the w may be not more than twenty nanometers. In some such embodiments, w may be ten nanometers or less. The width of the second hard mask layer remaining after step 162 may be well controlled. For example, once calibrated, the lateral RIE may have a sigma of not more than one to two nanometers. Although not shown, the lateral RIE of step 162 may not trim all layers 220", 230", and 242"/240" at the same rate. For example, there may be a slight undercut of the layers 220" and/or 230". However, such an undercut may not adversely affect the process 150.

Figure 10:
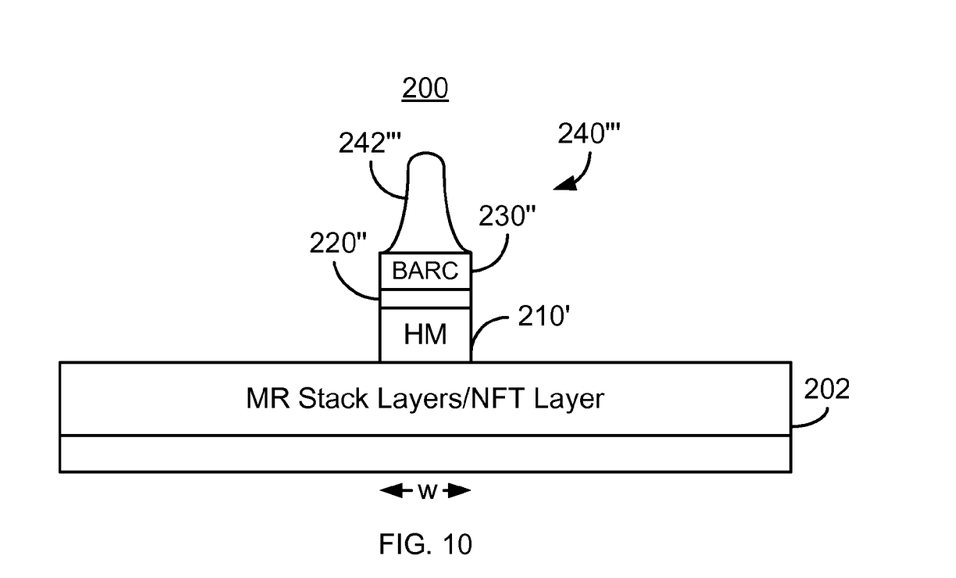

The pattern of the Cr hard mask is transferred to the SiC hard mask layer using a SiC RIE, via step 164. The selectivity between the Cr layer 220" and SiC hard mask layer 210 is high. Thus, the line pattern of the Cr hard mask layer 220"

may be transferred to the SiC hard mask layer 220' without consuming a significant amount of the Cr hard mask layer 230" and without substantially changing the width of the Cr hard mask layer 230". FIG. 10 depicts the transducer 200 after step 164 is performed. Thus, the SiC hard mask layer 210' having width w is shown. In the embodiment shown, not all of the line 242''' of the photoresist mask 240''' is consumed. However, in other embodiments, no photoresist might remain after step 164 is completed.

Figure 11:
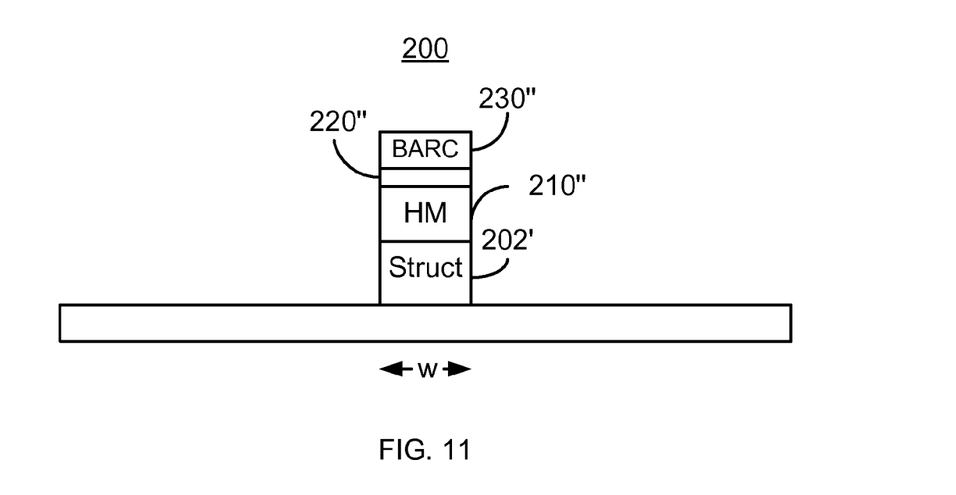

The pattern of the SiC hard mask layer 230' is transferred to the underlying layer(s) 202 for the structure, via step 166. FIG. 11 depicts the transducer 200 after step 166 is performed. Thus, structure 202' having width 2 is shown. Thus, the structure has substantially the same width as the trimmed SiC hard mask layer. Further, the line of the photoresist mask has been consumed. Fabrication of the transducer may then be completed, via step 168.

Using the method 150, the transducer 200 may be formed. The benefits described above with respect to the method 100 may thus be achieved. For example, lower track width structures having relatively low errors may be reliably achieved. Accordingly, performance and fabrication of the transducer 100 may be improved.

I claim:

1. A method for forming a structure in a magnetic recording head from at least one layer corresponding to the structure, the method comprising:
    providing a first hard mask layer on the at least one layer;
    providing a second hard mask layer on the first hard mask layer;
    providing a bottom antireflective coating (BARC) layer on the second hard mask layer;
    providing a photoresist mask having a pattern on the second hard mask layer, the pattern including a line corresponding to the structure;
    transferring the pattern to the BARC layer and the second hard mask layer in a single etch using a first etch chemistry, the step of transferring the pattern being a vertical anisotropic etch;
    trimming at least the second hard mask layer, the photoresist mask and the BARC layer using a second etch chemistry substantially the same as the first etch chemistry to provide a mask including a hard mask line corresponding to the line and having a width of less than thirty nanometers, the hard mask line including a remaining portion of the second hard mask layer, the step of trimming being a horizontal anisotropic etch configured to remove material in a direction substantially perpendicular to the vertical anisotropic etch;
    transferring the pattern of the second hard mask including the hard mask line to the first hard mask layer after the step of trimming the at least the second hard mask layer, a remaining portion of the photoresist mask being consumed during the step of transferring the pattern; and
    transferring the pattern of the first hard mask layer to the at least one layer such that the structure substantially has the width.

2. The method of claim 1 wherein the step of transferring the pattern to the BARC layer and the second hard mask layer further includes:
    performing a reactive ion etch (RIE).

3. The method of claim 2 wherein the RIE is a vertical RIE.

4. The method of claim 3 wherein the step of performing the RIE further includes:
    terminating the vertical RIE based on end point detection.

5. The method of claim 1 wherein the step of trimming the second hard mask further includes:
    performing a reactive ion etch (RIE).

6. The method of claim 5 wherein the RIE is a lateral RIE.

7. The method of claim 1 wherein the first chemistry and the second chemistry each includes oxygen and chlorine.

8. The method of claim 7 wherein the first chemistry and the second chemistry each includes an additional diluting gas.

9. The method of claim 8 wherein the diluting gas is at least one of He, $N_2$, and Ar.

10. The method of claim 1 wherein the second hard mask includes Cr.

11. The method of claim 10 wherein the second hard mask consists of at least one of Cr, chrome oxide, and chrome oxynitride.

12. The method of claim 1 wherein the second hard mask has a thickness of not more than two hundred Angstroms.

13. The method of claim 12 wherein the thickness is not more than fifty Angstroms.

14. The method of claim 1 wherein the structure includes at least one of a magnetoresistive sensor and a near-field transducer.

15. The method of claim 1 wherein the first chemistry is equivalent to the second chemistry.

16. A method for forming a structure in a magnetic recording head from at least one layer corresponding to the structure, the method comprising:
    providing a first hard mask layer on the at least one layer;
    providing a Cr layer on the first hard mask layer, the Cr layer having a thickness of not more than fifty Angstroms;
    providing a bottom antireflective coating (BARC) layer on the Cr layer;
    providing a photoresist mask having a pattern on the Cr layer, the pattern including a line corresponding to the structure;
    transferring the pattern to the BARC layer and the Cr layer in a first anisotropic reactive ion etch (RIE) using a first etch chemistry including Cl and O, the first anisotropic RIE removing more of the Cr layer in a direction perpendicular to a plane of the Cr layer than in the plane of the Cr layer and being a single anisotropic RIE;
    trimming the Cr layer, the photoresist mask and the BARC layer using a second anisotropic RIE having a second etch chemistry substantially the same as the first etch chemistry, the second anisotropic RIE removing more of the Cr layer in the plane of the Cr layer than in the direction perpendicular to the plane of the Cr layer, thereby providing a mask including a hard mask line corresponding to the line and having a width of less than thirty nanometers;
    transferring the pattern of the hard mask line to the first hard mask layer after the step of trimming the Cr layer, a remaining portion of the photoresist mask being consumed during the step of transferring the pattern; and
    transferring the pattern of the first hard mask layer to the at least one layer such that the structure substantially has the width.

* * * * *